US008829788B2

(12) United States Patent
Choi et al.

(10) Patent No.: US 8,829,788 B2
(45) Date of Patent: Sep. 9, 2014

(54) ORGANIC LIGHT EMITTING DISPLAY DEVICE AND MANUFACTURING METHOD THEREOF

(71) Applicant: Samsung Display Co., Ltd., Yongin-si (KR)

(72) Inventors: Jin-Baek Choi, Yongin (KR); Ji-Young Choung, Yongin (KR); Joon-Gu Lee, Yongin (KR); Yeon-Hwa Lee, Yongin (KR); Won-Jong Kim, Yongin (KR); Hyun-Sung Bang, Yongin (KR); Young-Woo Sung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/842,037

(22) Filed: Mar. 26, 2013

(65) Prior Publication Data
US 2014/0145585 A1 May 29, 2014

(30) Foreign Application Priority Data

Nov. 26, 2012 (KR) .................. 10-2012-0134414

(51) Int. Cl.
*H01L 51/52* (2006.01)
(52) U.S. Cl.
CPC .................. *H01L 51/5259* (2013.01)
USPC ............................. 313/504; 445/24
(58) Field of Classification Search
CPC . H01L 51/56; H01L 27/3246; H01L 51/5243; H05B 33/04
USPC ................................. 313/498–512
See application file for complete search history.

(56) References Cited

U.S. PATENT DOCUMENTS

| 2004/0012747 | A1* | 1/2004 | Yamazaki et al. ............ 349/153 |
| 2004/0108811 | A1* | 6/2004 | Klausmann et al. .......... 313/512 |
| 2007/0029928 | A1 | 2/2007 | Choi et al. |
| 2009/0315450 | A1 | 12/2009 | Kim et al. |
| 2012/0012849 | A1 | 1/2012 | Jo et al. |
| 2012/0169216 | A1 | 7/2012 | Son et al. |
| 2012/0181544 | A1 | 7/2012 | Lee et al. |

FOREIGN PATENT DOCUMENTS

| JP | 2008-103173 | 5/2008 |
| KR | 10-0637129 | 10/2006 |
| KR | 10-2010-0000407 | 1/2010 |
| KR | 10-2010-0067761 | 6/2010 |
| KR | 10-2012-0007305 | 1/2012 |
| KR | 10-2012-0077403 | 7/2012 |
| KR | 10-2012-0082670 | 7/2012 |

OTHER PUBLICATIONS

KIPO Notice of Allowance dated May 22, 2014, for Korean priority Patent application 10-2012-0134414, (2 pages).

* cited by examiner

*Primary Examiner* — Donald Raleigh
(74) *Attorney, Agent, or Firm* — Christie, Parker & Hale, LLP

(57) ABSTRACT

Provided is an organic light emitting display device including: a substrate; first electrodes on the substrate; an emission layer on the first electrodes; a second electrode on the emission layer; a pixel defining layer separating the first electrodes corresponding to pixels and defining pixel areas; and a gas collecting layer on the pixel defining layer.

18 Claims, 4 Drawing Sheets

ORGANIC LIGHT EMITTING DISPLAY DEVICE AND MANUFACTURING METHOD THEREOF

CROSS-REFERENCE TO RELATED APPLICATIONS

This application claims priority to and the benefit of Korean Patent Application No. 10-2012-0134414, filed on Nov. 26, 2012, with the Korean Intellectual Property Office, the present disclosure of which is incorporated herein in its entirety by reference.

BACKGROUND

1. Field

The present disclosure relates to an organic light emitting display device and a manufacturing method thereof.

2. Description of Related Art

An organic light emitting display device is a self-emission display device which has an organic light emitting diode that emits light to display an image. Since the organic light emitting display device does not require a separate light source as in a liquid crystal display, it is possible to relatively reduce thickness and weight thereof. Furthermore, there are other aspects to an organic light emitting display device such as low power consumption, high luminance, and rapid response speed.

In the organic light emitting display device, pixels that emit light are partitioned by a pixel defining layer. The pixel defining layer is made of an organic material such as acryl, and the acryl discharges outgas in a sintering or driving process. Further, the outgas is discharged from a lower substrate in the organic light emitting display device.

The outgas deteriorates a characteristic of the organic light emitting display device, releases the pixel defining layer, and reduces a lifespan of the organic light emitting display device.

Meanwhile, the organic light emitting display device generally includes an absorbing layer for preventing oxygen or moisture from penetrating from the outside. The absorbing layer scatters light due to an absorbent included therein, and as a result, the absorbing layer is not applied to the front emission type organic light emitting display device.

SUMMARY

Embodiments of the present invention provide an organic light emitting display device with an improved or increased lifespan by forming a gas collecting layer on the pixel defining layer to absorb outgas generated in the organic light emitting display device.

Embodiments of the present invention provide a manufacturing method of an organic light emitting display device with an improved or increased lifespan by forming a gas collecting layer on the pixel defining layer to absorb outgas generated in the organic light emitting display device.

An exemplary embodiment of the present disclosure provides an organic light emitting display device including: a substrate; first electrodes on the substrate; an emission layer on the first electrodes; a second electrode on the emission layer; a pixel defining layer separating the first electrodes corresponding to pixels and defining pixel areas; and a gas collecting layer on the pixel defining layer.

The gas collecting layer may be adapted to absorb gas generated in the organic light emitting display device.

The gas collecting layer may include metal or metal oxide.

The metal may be alkali metal or alkaline earth metal.

The metal oxide may be alkali metal oxide or alkaline earth metal oxide.

The metal oxide may be selected from the group consisting of lithium oxide ($Li_2O$), sodium oxide ($Na_2O$), potassium oxide ($K_2O$), barium oxide (BaO), calcium oxide (CaO), magnesium oxide (MgO), and combinations thereof.

The metal may be selected from the group consisting of potassium (K), barium (Ba), calcium (Ca), magnesium (Mg), and combinations thereof.

The metal oxide may be CaOx, and the X may have a range of about 0.5 to about 1.

A thickness of the gas collecting layer may be in a range of about 1 nm to about 4,000 nm, and a refractive index of the gas collecting layer may be in a range of about 1.55 to about 1.8.

Another exemplary embodiment of the present disclosure provides a manufacturing method of an organic light emitting display device including: forming first electrodes on a substrate; forming a pixel defining layer defining pixel areas by separating the first electrodes corresponding to pixels; forming a gas collecting layer on the pixel defining layer; forming an emission layer on the first electrodes corresponding to the pixel areas; and forming a second electrode on the emission layer.

The gas collecting layer may absorb gas generated in the organic light emitting display device.

The gas collecting layer may include metal or metal oxide.

The metal may be alkali metal or alkali earth metal.

The metal oxide may be alkali metal oxide or alkali earth metal oxide.

The metal oxide may be selected from the group consisting of lithium oxide ($Li_2O$), sodium oxide ($Na_2O$), potassium oxide ($K_2O$), barium oxide (BaO), calcium oxide (CaO), magnesium oxide (MgO), and combinations thereof.

The metal may be selected from the group consisting of potassium (K), barium (Ba), calcium (Ca), magnesium (Mg), and combinations thereof.

The metal oxide may be CaOx, and the X may have a range of about 0.5 to about 1.

A thickness of the gas collecting layer may be in a range of about 1 nm to about 4,000 nm, and a refractive index of the gas collecting layer may be in a range of about 1.55 to about 1.8.

According to the exemplary embodiments of the present disclosure, the organic light emitting display device and the manufacturing method thereof may be applied to a front emission type because light transmittancy is not deteriorated due to the gas collecting layer, and a lifespan of the organic light emitting display device can be improved or increased by absorbing outgas generated from the pixel defining layer and the lower substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
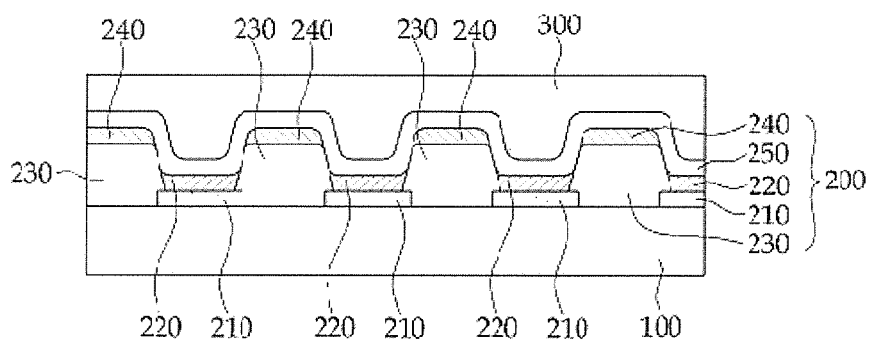
FIG. 1 is a cross-sectional view illustrating an organic light emitting display device according to an exemplary embodiment of the present disclosure.

Hereinafter, exemplary embodiments of the present disclosure will be described in more detail with reference to the accompanying drawings. However, the scope of the present disclosure is not limited to the following examples and drawings. Exemplary embodiments to be described below and illustrated in the drawings may include various equivalences and modifications.

The terminology used in this specification is used in order to express the exemplary embodiments of the present disclosure and may depend on the intention of users or operators or the custom in the art to which the present disclosure belongs. Accordingly, the terminology is to be defined based on details throughout this specification.

For reference, respective components and shapes thereof may be schematically drawn or exaggeratedly drawn in the accompanying drawings for easy understanding. Like reference numerals designate like elements throughout the drawings.

It will be understood that when a layer or an element is described as being "on" another layer or element, it may be directly on or directly disposed on another layer or element, or an intervening layer or element may also be present.

FIG. 1 is a cross-sectional view illustrating an organic light emitting display device according to an exemplary embodiment of the present disclosure.

Referring to FIG. 1, the organic light emitting display device according to an exemplary embodiment of the present disclosure includes a substrate 100, a display unit 200, and an encapsulation layer 300.

The substrate 100 may be made of various materials such as a glass substrate, a quartz substrate, and/or a transparent resin substrate, and may be formed by using a flexible material. The transparent resin substrate which may be used as the substrate 100 may contain a polyimide resin, an acrylic resin, a polyacrylate resin, a polycarbonate resin, a polyether resin, a polyethylene terephthalate resin, a sulfonic acid resin, and/or the like.

In the case where the organic light emitting display device is a rear emission type displayed to or toward the substrate 100 side, the substrate 100 may be made of a light transmitting material, but in the case of a front emission type displayed to or toward the encapsulation layer 300, the substrate 100 may not necessarily be made of the light transmitting material.

The display unit 200 may include a first electrode 210 formed on the substrate 100, a pixel defining layer (PDL) 230 formed between the first electrodes 210, a gas collecting layer 240 formed on the pixel defining layer, an emission layer (or emission layers) 220 formed on the first electrode 210, and a second electrode 250 formed on the emission layer (or emission layers) 220.

In the case where the organic light emitting display device is a front emission type, the first electrode 210 may contain at least one of gold (Au), platinum (Pt), nickel (Ni), tungsten (W), chromium (Cr), molybdenum (Mo), iron (Fe), cobalt (Co), copper (Cu), palladium (Pd), titanium (Ti), or a compound thereof. In addition, the second electrode 250 may contain at least one of indium tin oxide (ITO) or indium zinc oxide (IZO), each of which is a transparent conductive oxide.

In the case where the organic light emitting display device is a rear emission type, the first electrode 210 may contain at least one of indium tin oxide (ITO) or indium zinc oxide (IZO), each of which is a transparent conductive oxide having a high work function. In addition, the second electrode 250 may be made of metal having a low work function, that is, an alkali metal such as lithium (Li) and cesium (Cs), an alkaline earth metal such as magnesium (Mg), calcium (Ca) and strontium (Sr), and/or a compound thereof.

In addition, the first electrode 210 and the second electrode 250 may contain materials which are known in the art.

The emission layer 220 may include a red emission layer, a green emission layer, and a blue emission layer. The emission layer 220 may be made of a low molecular organic material or a high molecular organic material.

The pixel defining layer 230 may be made of a material having an insulation property to partition the first electrodes 210 by a pixel unit. In detail, and according to an example embodiment, the pixel defining layer 230 is at an edge of the first electrode 210 to partition the first electrodes by a pixel unit and to define pixel areas. The pixel defining layer 230 covers the edge of the first electrode 210.

As the material having an insulation property constituting (or configuring) the pixel defining layer 230, an organic material such as acryl may be primarily used. The acryl may discharge gas in a sintering process or a driving process. The gas is called outgas. The outgas generally contains a lot of organic material components. For example, water ($H_2O$), carbon dioxide ($CO_2$), carbon monoxide (CO), oxygen ($O_2$), and the like may be included. Further, since the emission layer 220 may be made of an organic material, the emission layer 220 may discharge the outgas. In addition, a constituent element made of an organic material in the lower substrate may generally discharge the outgas.

The outgas may deteriorate a characteristic of the organic light emitting display device, and as a result, may reduce a lifespan of the organic light emitting display device. Accordingly, the lifespan of the organic light emitting display device may be improved by absorbing the outgas.

The gas collecting layer 240 may be formed on the pixel defining layer 230 in order to absorb the outgas.

In order to efficiently absorb the outgas emitted from the pixel defining layer 240, the gas collecting layer 240 may be formed directly on the pixel defining layer 230. Further, the gas collecting layer 240 may contain metal or metal oxide, and since the metal or the metal oxide is a factor in inhibiting current of the emission layer 220, the gas collecting layer 240 may not be formed in the emission layer 220 corresponding to an emission unit.

The gas collecting layer 240 may react with gas generated in the organic light emitting display device. The gas may be outgas, and the outgas may be discharged from the pixel defining layer 230 or the constituent elements made of the organic material. The gas collecting layer 240 may efficiently remove or reduce the outgas by reacting with the gas.

The gas collecting layer 240 may contain metal or metal oxide in order to absorb the gas by reacting with the gas. Further, the gas collecting layer 240 may also contain two components by mixing the metal and the metal oxide.

The metal or the metal oxide may directly react with the outgas to absorb the outgas.

The metal may be alkali metal or alkaline earth metal.

The metal may be selected from one or more of, but not limited to, potassium (K), barium (Ba), calcium (Ca), and magnesium (Mg).

The metal oxide may be alkali metal oxide or alkaline earth metal oxide.

The metal oxide may be selected from one or more of, but not limited to, lithium (Li), sodium (Na), potassium (K), barium (Ba), calcium (Ca), and magnesium (Mg) oxides.

The metal and the metal oxide may be selected based on materials that efficiently absorb outgas, and in addition, the gas collecting layer 240 may contain materials which are known in the art.

Figure 2:
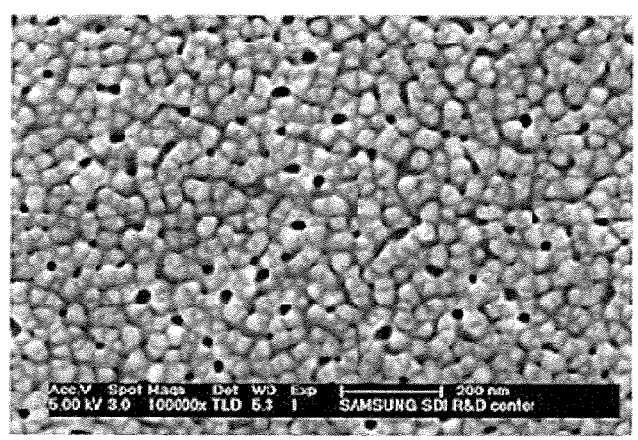
FIG. 2 is a surface photograph illustrating a gas collecting layer according to an exemplary embodiment of the present disclosure.

FIG. 2 is a surface photograph illustrating a gas collecting layer according to an exemplary embodiment of the present disclosure. Referring to FIG. 2, the gas collecting layer 240 may contain metal or metal oxide having an average particle diameter of about 100 nm or less.

The average particle diameter of the metal or the metal oxide may be about 100 nm or less. In another embodiment, the average particle diameter may range from about 1 nm to about 90 nm. If the average particle diameter is more than 100 nm, in the gas collecting layer 240 formed by using particles having this average particle diameter, a haze phenomenon in which the layer looks hazy may be caused when scattering occurs in the visible light region and transmittancy may deteriorate. For example, as illustrated in FIG. 2, the metal or the metal oxide may have a size of about 35 nm to about 50 nm.

As the metal or metal oxide particles become smaller, because the entire surface area of the gas collecting layer 240 becomes wider, it may collect the outgas. However, when the particles are excessively decreased, it may be difficult to disperse the particles in the gas collecting layer 240 in a manufacturing process and it may not be easy to form the gas collecting layer 240.

Because the gas collecting layer 240 may contain metal or metal oxide, the gas collecting layer 240 may have a porous structure having a plurality of pores. For example, the outgas is diffused through the pores of the gas collecting layer 240 and collected by being coupled with the metal or metal oxide particles.

According to the exemplary embodiment of the present disclosure, calcium oxide may be selected from the metal oxides with respect to absorption efficiency of the outgas. The calcium oxide may be represented by CaOx. In the case where Ca and O exist as 1:1, CaO is stabilized and does not react with the outgas, but in the case where a chemical quantity of O is insufficient or less as compared with Ca, because probability to collect the outgas is high, the X range of CaOx may be from about 0.5 to about 1.

Figure 3:
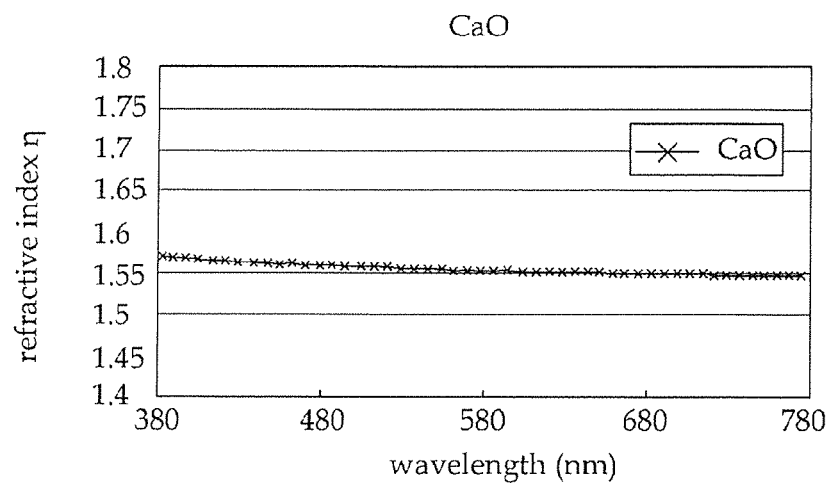
FIG. 3 is a graph illustrating a refractive index at air atmosphere of a gas collecting layer containing CaOx according to an exemplary embodiment of the present disclosure.

FIG. 3 is a graph illustrating a refractive index of a gas collecting layer containing CaOx at air atmosphere according to an exemplary embodiment of the present disclosure.

The refractive index of the gas collecting layer 240 containing metal oxide may have a range of about 1.55 to about 1.8. For example, the refractive index of the CaOx has the range of about 1.55 to about 1.8, and the range is not an obstacle to light transmittance and light extraction. The refractive index of the gas collecting layer 240 may be, particularly, in the range of about 1.475 to about 1.594.

In FIG. 3, CaOx is CaO and X is 1. When the thickness of the CaO is 480 nm, it is verified that a refractive index n of the gas collecting layer 240 containing CaO is 1.55 to 1.6. For reference, a refractive index of CaO bulk particles is 1.84, and generally, a refractive index of CaO is 1.8. However, an experimental value of the gas collecting layer 240 containing CaO is low as compared with the general value, and, as illustrated in FIG. 2, the reason is that the gas collecting layer 240 has a porous shape. As a result, experimentally, it is verified that the refractive index of the gas collecting layer 240 may be efficiently in the range of about 1.475 to about 1.594. In the case where the gas collecting layer 240 has this refractive index, the gas collecting layer 240 may not have a special difference in a reflective index between the gas collecting layer and another adjacent layer.

Figure 4:
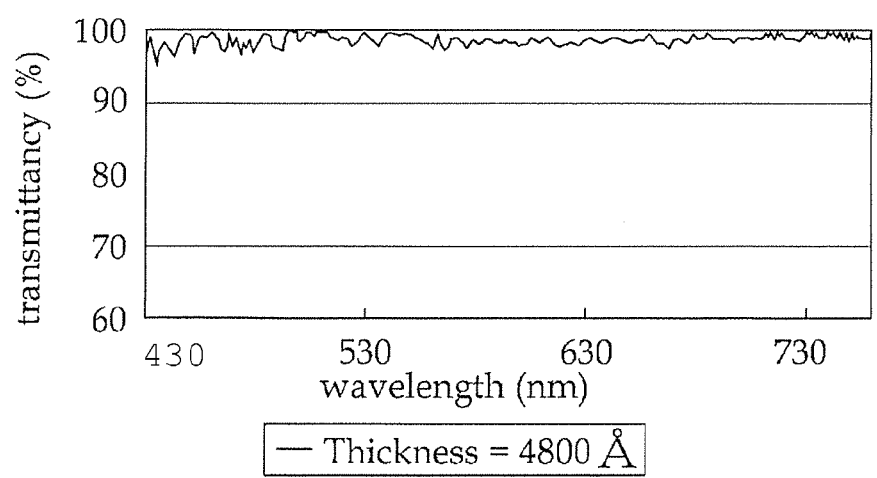
FIG. 4 is a graph illustrating a transmittancy result of the gas collecting layer containing CaOx according to an exemplary embodiment of the present disclosure.

FIG. 4 is a graph illustrating a transmittancy result of the gas collecting layer containing CaOx according to an exemplary embodiment of the present disclosure. Referring to FIG. 4, when the thickness of CaO is 480 nm (4,800 Å), the transmittancy of the gas collecting layer 240 is 95% or more in a visible light wavelength band. Accordingly, although the gas collecting layer 240 is formed, light transmittancy of the organic light emitting display device may not be nearly influenced, and the present disclosure may also be applied to the front emission type organic light emitting display device. As a result, the gas collecting layer 240 may be transparent and may have little distortion.

The thickness of the gas collecting layer 240 may be in the range of about 1 nm to about 4,000 nm. If the thickness of the gas collecting layer 240 is less than 1 nm (10 Å), the gas collecting layer 240 may not have a sufficient absorption property, and when the thickness of the gas collecting layer 240 is 4,000 nm (40,000 Å), transmittancy of light may deteriorate. Further, since there is a limit to the thickness to which the gas may penetrate, even though the thickness of the gas collecting layer 240 may be large, collection efficiency of the gas may not be increased, but only the overall structure may become thicker. For example, the thickness of the gas collecting layer 240 may be in the range of about 10 nm to about 4,000 nm.

The gas collecting layer 240 may be formed by a method such as vacuum deposition using a mask, and may be formed by a printing method such as inkjet or gravure printing. Alkali metal or alkali earth metal may be deposited at oxygen atmosphere to form the gas collecting layer 240 made of alkali metal oxide or alkali earth metal oxide, or a material made of alkali metal oxide or alkali earth metal oxide may be deposited at vacuum atmosphere to form the gas collecting layer 240 made of the material.

The deposition may be performed by physical vapor deposition, and may be performed at a substrate temperature ranging from about 20° C. to about 400° C. when the deposition is performed on the encapsulation substrate. If the substrate temperature is more than 400° C. during deposition, breakdown or bending of the substrate may occur.

The encapsulation layer 300 may have a structure in which organic layers and inorganic layers are alternately laminated. In order to prevent oxygen or moisture from penetrating from the outside, the organic layers may be positioned at the inside adjacent to the display unit, and the inorganic layers may be positioned outside the display unit.

Another exemplary embodiment of the present disclosure provides a manufacturing method of the organic light emitting display device. In detail, the manufacturing method includes forming a first electrode 210 on a substrate 100, forming the pixel defining layer 230 at an edge of the first electrode 210 that defines pixel areas by partitioning the first electrodes 210 by a pixel unit, forming a gas collecting layer 240 on the pixel defining layer 230, forming an emission layer 220 on the first electrode 210 so as to correspond to the pixel area, and forming a second electrode 250 on the emission layer 220.

FIGS. 5A to 5F are diagrams schematically illustrating a manufacturing process of the organic light emitting display device according to another exemplary embodiment of the present disclosure.

Figure 5A:
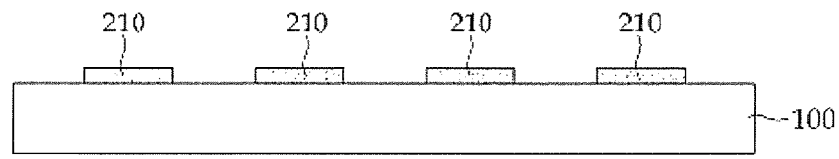
FIGS. 5A to 5F are diagrams schematically illustrating a manufacturing process of an organic light emitting display device according to an exemplary embodiment of the present disclosure.

In order to manufacture the organic light emitting display device, first, the first electrode 210 is formed on the substrate 100 (see FIG. 5A).

Figure 5B:
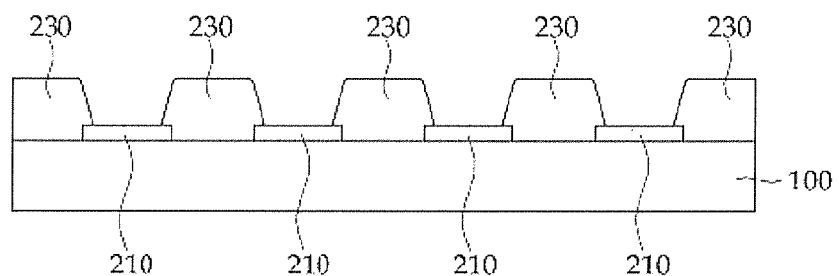

The pixel defining layer 230 is formed between the first electrodes 210 (see FIG. 5B). That is, after forming the first electrode 210, the pixel defining layer 230 partitioning the first electrode 210 by a pixel unit to define a pixel area is formed at an edge of the first electrode 210 (see FIG. 5B).

Figure 5C:
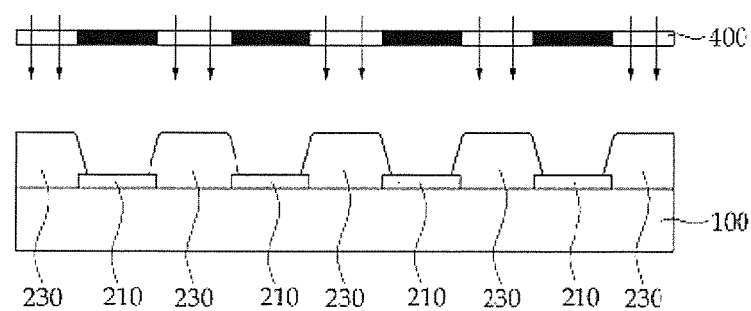

Next, a pattern mask 400 is formed or disposed on the pixel defining layer 230, and the gas collecting layer 240 may be thermally deposited on the pixel defining layer 230 through the pattern mask (see FIG. 5C).

A transmitting portion where a material for forming the gas collecting layer 240 is transmitted and a non-transmitting portion where the material for forming the gas collecting layer 240 is not transmitted are patterned and divided on the pattern mask 400.

The gas collecting layer 240 may be formed by a method such as vacuum deposition using a mask, and may be formed by a printing method such as inkjet or gravure printing and a sputtering method.

Figure 5D:
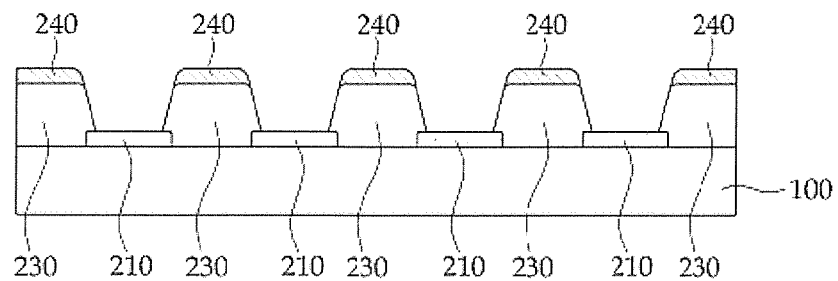

The gas collecting layer 240 is formed on the pixel defining layer 230, which may be accomplished through the thermal deposition process (see FIG. 5D).

Figure 5E:
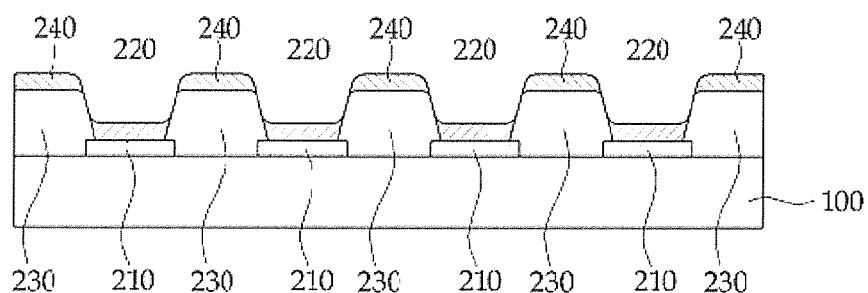

The opening formed by the pixel defining layer 230 becomes a pixel area, and in the forming of the emission layer 220, the emission layer 220 is formed on the first electrode 210 to be formed at a portion corresponding to the pixel area (see FIG. 5E).

Because the gas collecting layer 240 may be made of metal or metal oxide, the capacity to absorb the outgas is lost or reduced when the gas collecting layer 240 is exposed to air. Accordingly, in the forming of the emission layer 220, after making the gas collecting layer 240 be in a vacuum state, the organic material may be deposited.

Figure 5F:
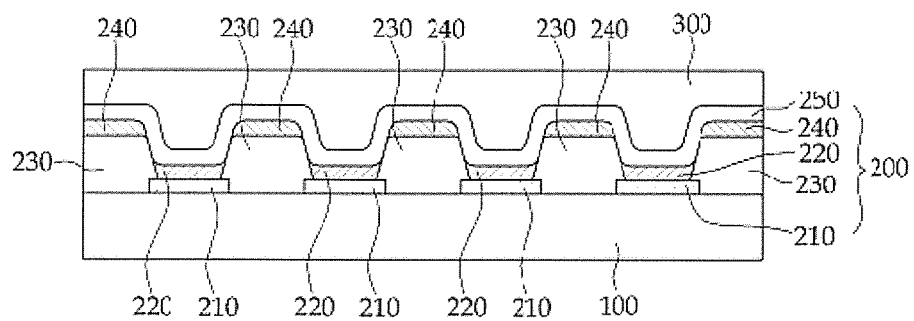

Next, the second electrode 250 is formed on the emission layer 220, and the encapsulation layer 300 is formed on the second electrode 250 (see FIG. 5F).

According to the manufacturing method of the gas collecting layer 240 of the present disclosure, since the gas collecting layer 240 may not be coated in a liquid state, but may be formed by selectively depositing only a desired area if only a mask exists, an etched glass substrate may not be required. Accordingly, the process may be very simple.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. An organic light emitting display device comprising:
    a substrate;
    first electrodes on the substrate;
    an emission layer on the first electrodes;
    a second electrode on the emission layer;
    a pixel defining layer separating the first electrodes corresponding to pixels and defining pixel areas; and
    a gas collecting layer between the pixel defining layer and the second electrode and spaced apart from the emission layer.

2. The organic light emitting display device of claim 1, wherein the gas collecting layer is adapted to absorb gas generated in the organic light emitting display device.

3. The organic light emitting display device of claim 1, wherein the gas collecting layer comprises metal or metal oxide.

4. The organic light emitting display device of claim 3, wherein the metal is alkali metal or alkali earth metal.

5. The organic light emitting display device of claim 3, wherein the metal oxide is alkali metal oxide or alkali earth metal oxide.

6. The organic light emitting display device of claim 3, wherein the metal oxide is selected from the group consisting of lithium oxide ($Li_2O$), sodium oxide ($Na_2O$), potassium oxide ($K_2O$), barium oxide (BaO), calcium oxide (CaO), magnesium oxide (MgO), and combinations thereof.

7. The organic light emitting display device of claim 3, wherein the metal is selected from the group consisting of potassium (K), barium (Ba), calcium (Ca), magnesium (Mg), and combinations thereof.

8. The organic light emitting display device of claim 3, wherein the metal oxide is $CaO_x$, and the X has a range of about 0.5 to about 1.

9. The organic light emitting display device of claim 1, wherein a thickness of the gas collecting layer is in a range of about 1 nm to about 4,000 nm, and a refractive index of the gas collecting layer is in a range of about 1.55 to about 1.8.

10. A manufacturing method of an organic light emitting display device comprising:
    forming first electrodes on a substrate;
    forming a pixel defining layer defining pixel areas by separating the first electrodes corresponding to pixels;
    forming a gas collecting layer between the pixel defining layer and the second electrode;
    forming an emission layer on the first electrodes corresponding to the pixel areas; and
    forming a second electrode on the emission layer, wherein the gas collecting layer is spaced apart from the emission layer.

11. The manufacturing method of the organic light emitting display device of claim 10, wherein the gas collecting layer absorbs gas generated in the organic light emitting display device.

12. The manufacturing method of the organic light emitting display device of claim 10, wherein the gas collecting layer comprises metal or metal oxide.

13. The manufacturing method of the organic light emitting display device of claim 12, wherein the metal is alkali metal or alkali earth metal.

14. The manufacturing method of the organic light emitting display device of claim 12, wherein the metal oxide is alkali metal oxide or alkali earth metal oxide.

15. The manufacturing method of the organic light emitting display device of claim 12, wherein the metal oxide is selected from the group consisting of lithium oxide ($Li_2O$), sodium oxide ($Na_2O$), potassium oxide ($K_2O$), barium oxide (BaO), calcium oxide (CaO), magnesium oxide (MgO), and combinations thereof.

16. The manufacturing method of the organic light emitting display device of claim 12, wherein the metal is selected from the group consisting of potassium (K), barium (Ba), calcium (Ca), magnesium (Mg), and combinations thereof.

17. The manufacturing method of the organic light emitting display device of claim 12, wherein the metal oxide is $CaO_x$, and the X has a range of about 0.5 to about 1.

18. The manufacturing method of the organic light emitting display device of claim 10, wherein a thickness of the gas collecting layer is in a range of about 1 nm to about 4,000 run, and a refractive index of the gas collecting layer is in a range of about 1.55 to about 1.8.

\* \* \* \* \*